(12) United States Patent
Tani

(10) Patent No.: US 10,665,767 B2
(45) Date of Patent: May 26, 2020

(54) LIGHT SOURCE DEVICE, PROJECTION-TYPE DISPLAY DEVICE, AND METHOD FOR COOLING SEMICONDUCTOR LIGHT-EMITTING ELEMENT

(71) Applicant: NEC Display Solutions, Ltd., Tokyo (JP)

(72) Inventor: Yusuke Tani, Tokyo (JP)

(73) Assignee: NEC DISPLAY SOLUTIONS, LTD., Tokyo (JP)

( * ) Notice: Subject to any disclaimer, the term of this patent is extended or adjusted under 35 U.S.C. 154(b) by 0 days.

(21) Appl. No.: 16/316,993

(22) PCT Filed: Aug. 30, 2016

(86) PCT No.: PCT/JP2016/075370
§ 371 (c)(1),
(2) Date: Jan. 10, 2019

(87) PCT Pub. No.: WO2018/042524
PCT Pub. Date: Mar. 8, 2018

(65) Prior Publication Data
US 2019/0252591 A1    Aug. 15, 2019

(51) Int. Cl.
*H01L 33/64* (2010.01)
*H01S 5/024* (2006.01)
*G03B 21/16* (2006.01)

(52) U.S. Cl.
CPC ............ *H01L 33/642* (2013.01); *G03B 21/16* (2013.01); *H01L 33/64* (2013.01); *H01S 5/024* (2013.01)

(58) Field of Classification Search
None
See application file for complete search history.

(56) References Cited

U.S. PATENT DOCUMENTS

| | | | |
|---|---|---|---|
| 2005/0117077 A1* | 6/2005 | Utsunomiya | G02F 1/133385 349/5 |
| 2010/0253923 A1* | 10/2010 | Yanagisawa | F28D 15/00 353/54 |
| 2011/0001937 A1* | 1/2011 | Matsumoto | G03B 21/16 353/54 |

FOREIGN PATENT DOCUMENTS

| | | |
|---|---|---|
| JP | S62-149180 A | 7/1987 |
| JP | 2009-237546 A | 10/2009 |

(Continued)

OTHER PUBLICATIONS

International Search Report (ISR) (PCT Form PCT/ISA/210), in PCT/JP2016/075370, dated Nov. 8, 2016.

*Primary Examiner* — Britt D Hanley
(74) *Attorney, Agent, or Firm* — McGinn I.P. Law, Group, PLLC.

(57) ABSTRACT

A light source device includes a light source bank that accommodates a plurality of semiconductor light-emitting elements, and a light source bank holder that mounts the light source bank on a first surface and includes a cooling mechanism provided on a second surface that is a back surface of the first surface. The cooling mechanism includes a heat dissipating part provided at a position corresponding to the light source bank with the light source bank holder interposed therebetween, a flow path cover that covers the second surface so as to accommodate the heat dissipating part, an inflow terminal into which a coolant flows, the inflow terminal being provided on the flow path cover, an outflow terminal from which the coolant flows out, the outflow terminal being provided on the flow path cover, so that a flow path by the heat dissipating part is formed between the outflow terminal and the inflow terminal, and a first flow path that is smaller in resistance than the flow path (Continued)

formed in the heat dissipating part and is formed between the inflow terminal and the heat dissipating part.

20 Claims, 8 Drawing Sheets

(56) References Cited

FOREIGN PATENT DOCUMENTS

| | | |
|---|---|---|
| JP | 2010-098204 A | 4/2010 |
| JP | 2015-060744 A | 3/2015 |
| JP | 2015-130461 A | 7/2015 |

* cited by examiner

LIGHT SOURCE DEVICE, PROJECTION-TYPE DISPLAY DEVICE, AND METHOD FOR COOLING SEMICONDUCTOR LIGHT-EMITTING ELEMENT

TECHNICAL FIELD

The present invention relates to a light source device and a projection-type display device and also relates to a method for cooling a semiconductor light-emitting element.

BACKGROUND ART

A semiconductor light-emitting element such as a light emitting diode (LED) or a laser diode (LD), which can be used as a light source or the like for a projection-type display device, emits light when electricity flows and also generates heat upon emission of the light. When the temperature of the semiconductor light-emitting element increases, the luminous efficiency decreases and a sufficient amount of light cannot be obtained. In addition, the lifetime of the semiconductor light-emitting element becomes shorter. In the projection-type display device, in order to stably exhibit optical performance and to continuously maintain the performance, it is necessary to cool the semiconductor light-emitting element and to control the temperature to a predetermined level or less while in use.

Patent Literature 1 (JP2015-130461A) discloses a technique serving as a cooling system of a semiconductor light-emitting element, in which an installation member on which a laser diode is installed is provided in the internal space of a hermetically sealed housing, a coolant flow path is provided in the installation member, and an inlet end and an outlet end of the coolant flow path are used as an external space of the hermetically sealed housing.

CITATION LIST

Patent Literature

Patent Literature 1: JP2015-130461A

SUMMARY OF INVENTION

Technical Problem

In the technique disclosed in the Patent Literature 1, a semiconductor light-emitting element to be cooled is cooled by a coolant flow path. The coolant flow path receives heat from the cooling target through a coolant such as liquid or gas circulating in the coolant flow path. The coolant that received heat is discharged from the outlet of the coolant flow path to a radiator and is cooled by heat dissipation performed by the radiator. Then, the coolant is returned again to the inlet of the coolant flow path by a pump.

The temperature of the coolant circulating in the coolant flow path rises as the heat is received, and the temperature at the outlet end of the coolant flow path becomes higher than the temperature at the inlet end.

Recent projection-type display devices are required to have high luminance Consequently, a plurality of high-power semiconductor light-emitting elements constituting the light source is used. By arranging the plurality of semiconductor light-emitting elements that have the same emission surface in an array, the luminance of the light source becomes higher but the amount of heat generation increases correspondingly.

When the plurality of semiconductor light-emitting elements is cooled using the coolant flow path disclosed in the Patent Literature 1, the temperature of the semiconductor light-emitting element to be cooled does not become uniform because of a difference in the coolant temperature between the inlet end and the outlet end. Since the output intensity of the semiconductor light-emitting element fluctuates depending on the operating temperature, luminance unevenness occurs in the output light of each semiconductor light-emitting element and color unevenness also occurs in the image light projected by the projection-type display device.

The object of the present invention is to provide a light source device and a projection-type display device that are capable of cooling a plurality of semiconductor light-emitting elements more uniformly, and a method for cooling the semiconductor light-emitting elements.

Solution to Problem

A light source device according to the present invention includes a plurality of semiconductor light-emitting elements, a light source bank that accommodates the plurality of semiconductor light-emitting elements, and a light source bank holder that mounts the light source bank on a first surface and includes a cooling mechanism provided on a second surface that is a back surface of the first surface, wherein the cooling mechanism includes a heat dissipating part provided at a position corresponding to the light source bank with the light source bank holder interposed therebetween, a flow path cover that covers the second surface so as to accommodate the heat dissipating part, an inflow terminal into which a coolant flows, the inflow terminal being provided on the flow path cover, an outflow terminal from which the coolant flows out, the outflow terminal being provided on the flow path cover, so that a flow path by the heat dissipating part is formed between the outflow terminal and the inflow terminal, and a first flow path that is smaller in resistance than the flow path formed in the heat dissipating part and is formed between the inflow terminal and the heat dissipating part.

A projection-type display device according to the present invention includes the above-mentioned light source device.

A semiconductor light-emitting element cooling method according to the present invention is a method for cooling a plurality of semiconductor light-emitting elements accommodated in a light source bank, which includes mounting the light source bank on a first surface of a light source bank holder, and providing a cooling mechanism on a second surface that is a back surface of the first surface, and further as the cooling mechanism, providing a heat dissipating part at a position corresponding to the light source bank with the light source bank holder interposed therebetween, covering the second surface with a flow path cover so as to accommodate the heat dissipating part, providing an inflow terminal into which a coolant flows on the flow path cover, proving an outflow terminal from which the coolant flows out on the flow path cover, so that a flow path by the heat dissipating part is formed between the outflow terminal and the inflow terminal, and forming a first flow path smaller in resistance than the flow path formed in the heat dissipating part between the inflow terminal and the heat dissipating part.

Advantageous Effect of Invention

In the present invention that has the above-mentioned configuration, the plurality of semiconductor light-emitting elements can be cooled more uniformly.

DESCRIPTION OF EMBODIMENTS

Hereinafter, exemplary embodiments will be described with reference to attached drawings.

First Exemplary Embodiment

Figure 1:
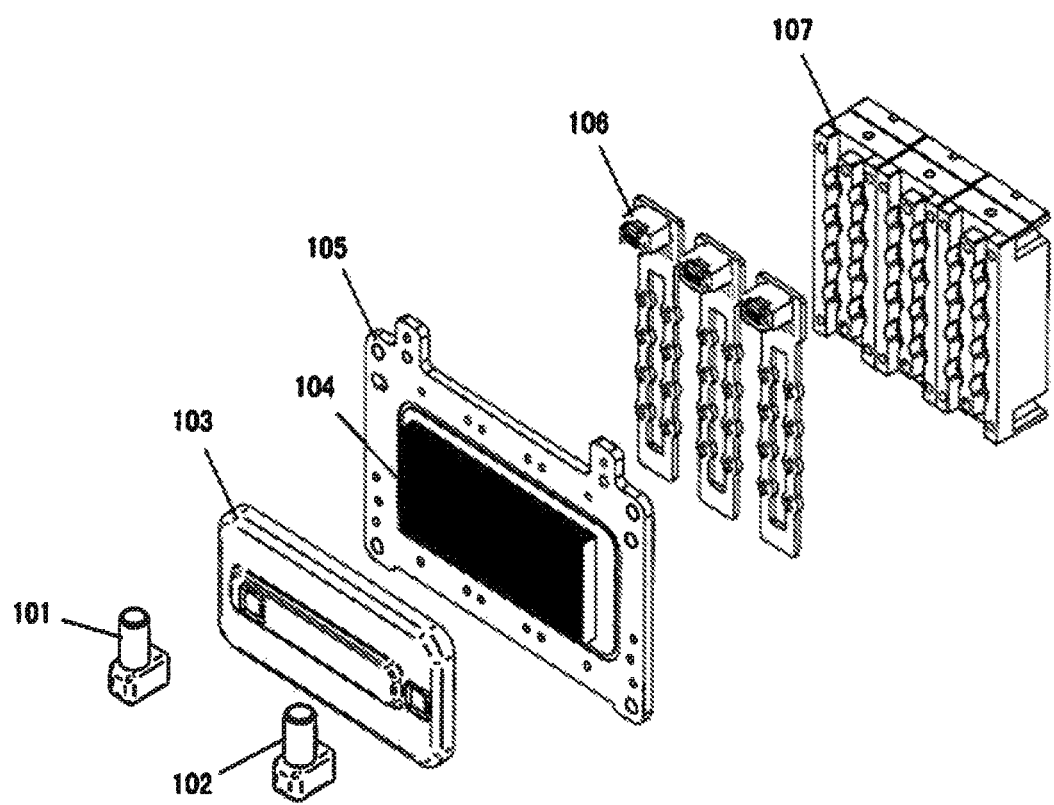
FIG. 1 is an exploded perspective view illustrating the configuration of a light source device according to an exemplary embodiment.
Figure 2:
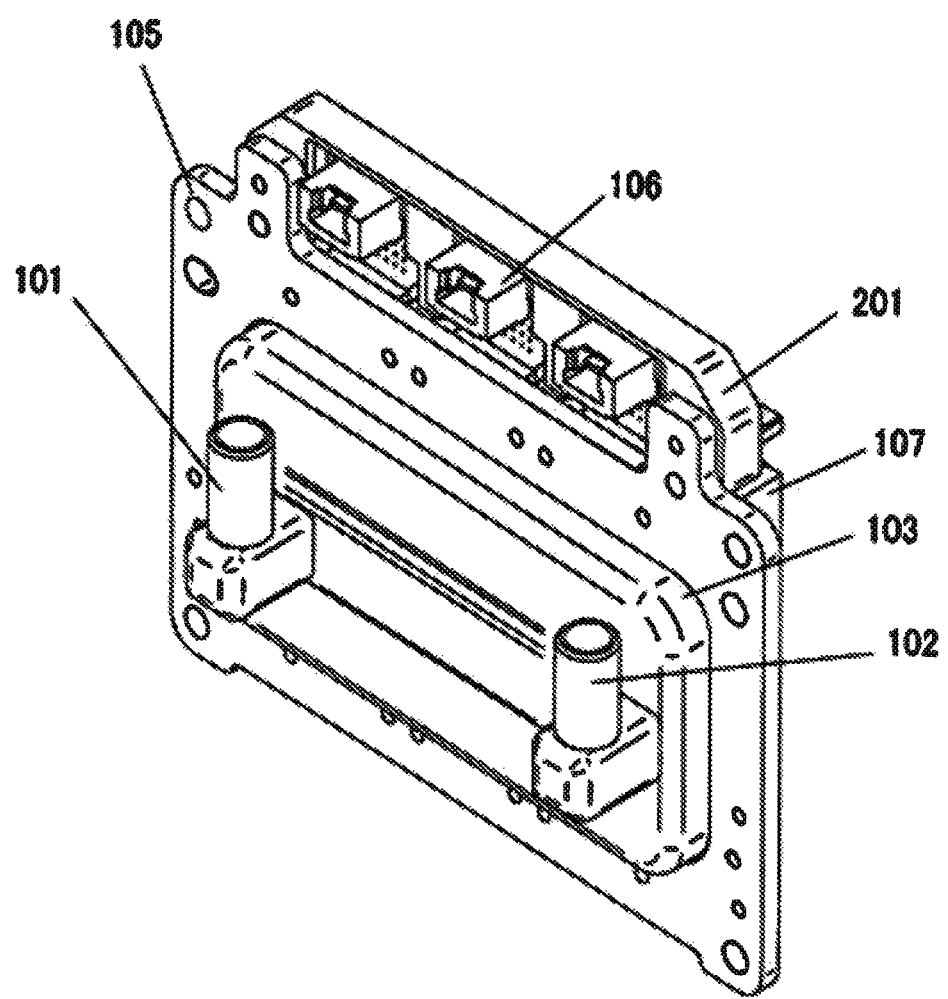
FIG. 2 is a perspective view illustrating an assembly of the exemplary embodiment illustrated in FIG. 1.
Figure 3:
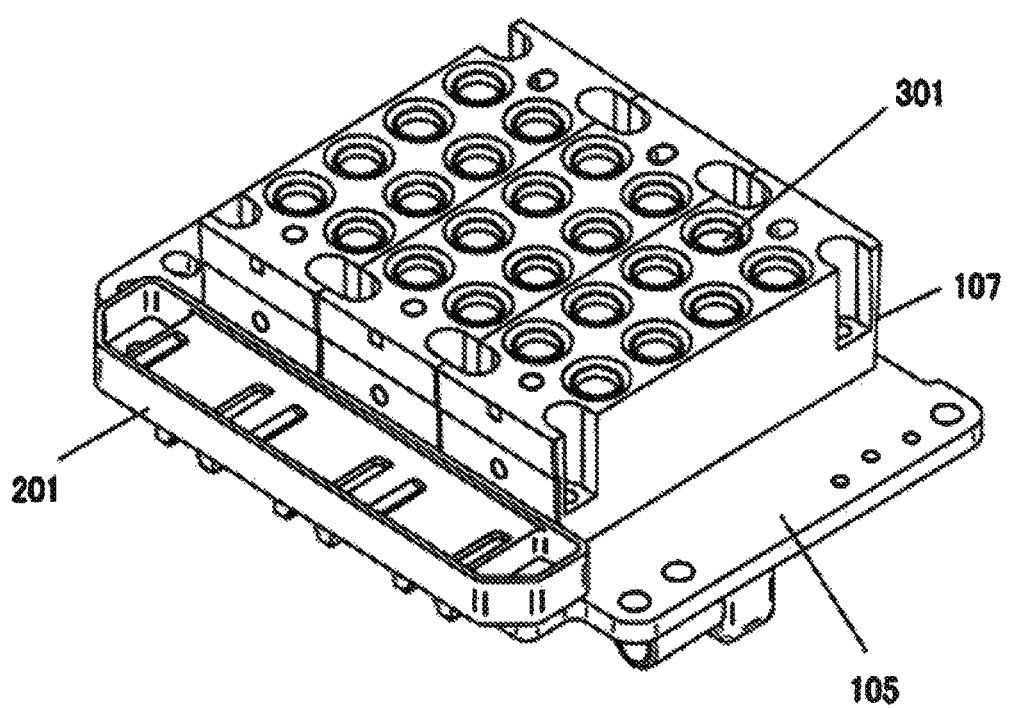
FIG. 3 is a perspective view illustrating the assembly of the exemplary embodiment illustrated in FIG. 1.

FIG. 1 is an exploded perspective view illustrating the configuration of a light source device according to an exemplary embodiment, and FIGS. 2 and 3 are perspective views illustrating an assembly thereof.

As illustrated in FIG. 1, the light source device according to the present exemplary embodiment includes inflow port 101, outflow port 102, flow path cover 103, heat dissipating part 104, light source bank holder 105, light source substrate 106, and light source bank 107.

Heat dissipating part 104 configured to include a plurality of parallel fins is formed on light source bank holder 105. Inflow port 101 and outflow port 102, which serve as an inlet and an outlet for a coolant, are attached to flow path cover 103 that covers heat dissipating part 104.

Light source substrate holder 201 and light source bank 107 are mounted on a side where heat dissipating part 104 of light source bank holder 105 is not formed, as illustrated in FIG. 2. A total of three light source banks 107 accommodate three light source substrates 106. A total of eight semiconductor light-emitting elements 301, each being an LD, are mounted on each of three light source substrates 106, as illustrated in FIG. 3. Light emitted from each semiconductor light-emitting element 301 exits through an opening that is provided on light source bank 107 so as to correspond to each semiconductor light-emitting element.

Light source bank 107 is in direct contact with accommodated CAN-type semiconductor light-emitting elements 301 and light source bank holder 105. In the present exemplary embodiment, each semiconductor light-emitting element 301 is cooled, via light source bank 107 and light source bank holder 105, by a cooling mechanism constituted by heat dissipating part 104 and the like provided in light source bank holder 105.

Figure 4:
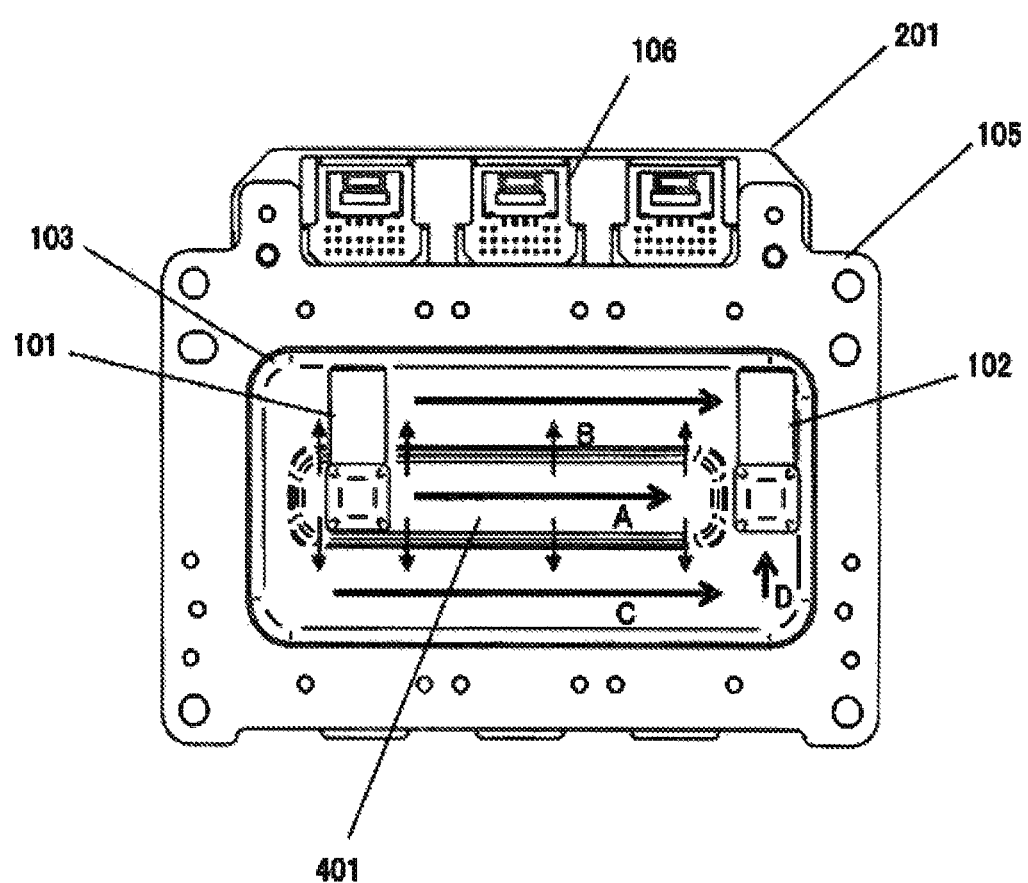
FIG. 4 is a plan view for explaining a cooling operation of the exemplary embodiment illustrated in FIG. 1.
Figure 5:
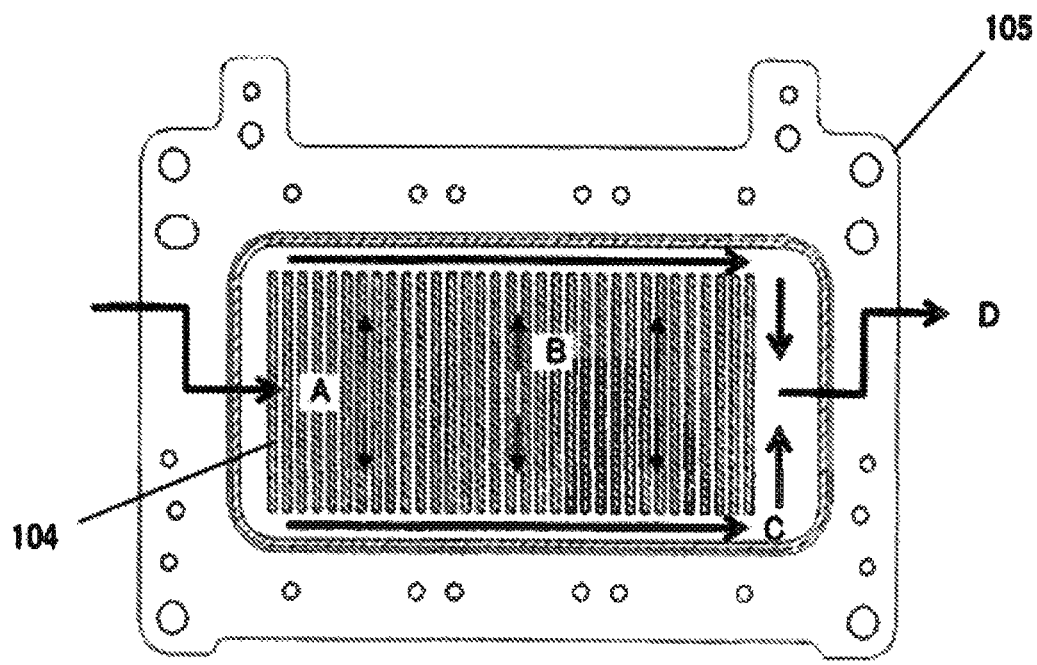
FIG. 5 is a plan view for explaining a cooling operation of the exemplary embodiment illustrated in FIG. 1.
Figure 6:
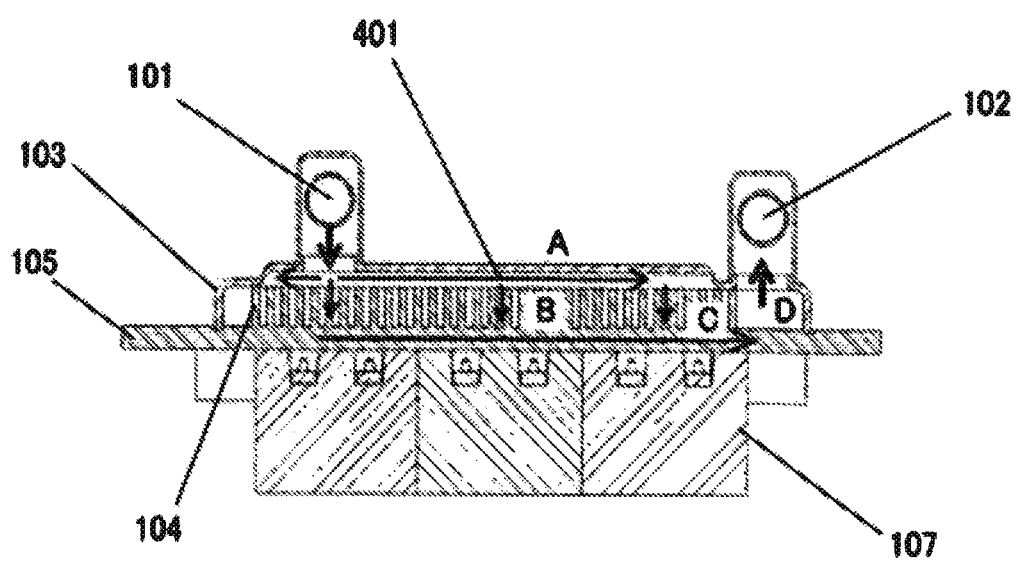
FIG. 6 is a cross-sectional view for explaining a cooling operation of the exemplary embodiment illustrated in FIG. 1.

FIGS. 4 to 7 are views for explaining a cooling operation that can be performed in the present exemplary embodiment. FIG. 4 is a plan view. FIG. 5 is a plan view illustrating a proceeding coolant in a state where flow path cover 103 illustrated in FIG. 4 is removed. FIG. 6 is a cross-sectional view.

Flow path cover 103 according to the present exemplary embodiment covers heat dissipating part 104 having the fin configuration and formed on light source bank holder 105 so as to form a flow path. Heat dissipating part 104 having the fin configuration is provided between inflow port 101 and light source bank holder 105. Heat dissipating part 104 having the fin configuration is not provided between outflow port 102 and light source bank holder 105. Further, as illustrated in the plan view of FIG. 4 and the cross-sectional view of FIG. 6, first flow path 401 is provided on the side of inflow port 101 of heat dissipating part 104, so that first flow path 401 communicates with inflow port 101 and extends straight from inflow port 101 toward outflow port 102 that serves as an outlet for the coolant.

First flow path 401 constitutes the cooling mechanism together with inflow port 101, outflow port 102, flow path cover 103, and heat dissipating part 104. As illustrated in FIG. 5, the fins that form heat dissipating part 104 having a rectangular shape are formed in parallel with each other so as to let the up-and-down direction in the drawings be the longer direction. While letting the right-and-left direction in the drawings be the longer direction, first flow path 401 connects substantially the centers of opposite sides parallel to the plurality of fins configuring heat dissipating part 104 and has an elongated shape so as to straddle all of respective fins configuring heat dissipating part 104.

First flow path 401 that has nothing provided between inflow port 101 and heat dissipating part 104 is smaller in resistance than the flow path formed in heat dissipating part 104 having the fin configuration. Therefore, after having flown into through inflow port 101, the coolant first fills first flow path 401, as indicated by arrow A in FIGS. 4 to 6.

As described above, each semiconductor light-emitting element 301 is cooled, via light source bank 107 and light source bank holder 105, by the cooling mechanism constituted by heat dissipating part 104 and the like provided on light source bank holder 105. Although light source bank 107 and heat dissipating part 104 are provided on light source bank holder 105, their installation positions coincide with each other across light source bank holder 105, as illustrated in FIG. 6.

The coolant having filled first flow path 401 flows toward the forming surface of heat dissipating part 104 of light source bank holder 105 through heat dissipating part 104 having the fin configuration, as indicated by arrow B in FIGS. 4 to 6. At the time of transition from the state of arrow A to the state of arrow B, the coolant has not yet started an operation for receiving heat from heat dissipating part 104. Therefore, the temperature of the coolant flowing toward the forming surface of heat dissipating part 104 becomes the same irrespective of the distance from inflow port 101. Therefore, light source bank 107 and semiconductor light-emitting elements 301 accommodated in light source bank 107 can be cooled under the same conditions.

The coolant having reached the forming surface of heat dissipating part 104 flows toward outflow port 102 along a side portion of heat dissipating part 104 having the fin configuration, as indicated by arrow C in FIGS. 4 to 6, and then flows out from outflow port 102, as indicated by arrow D in FIGS. 4 to 6.

Figure 7:
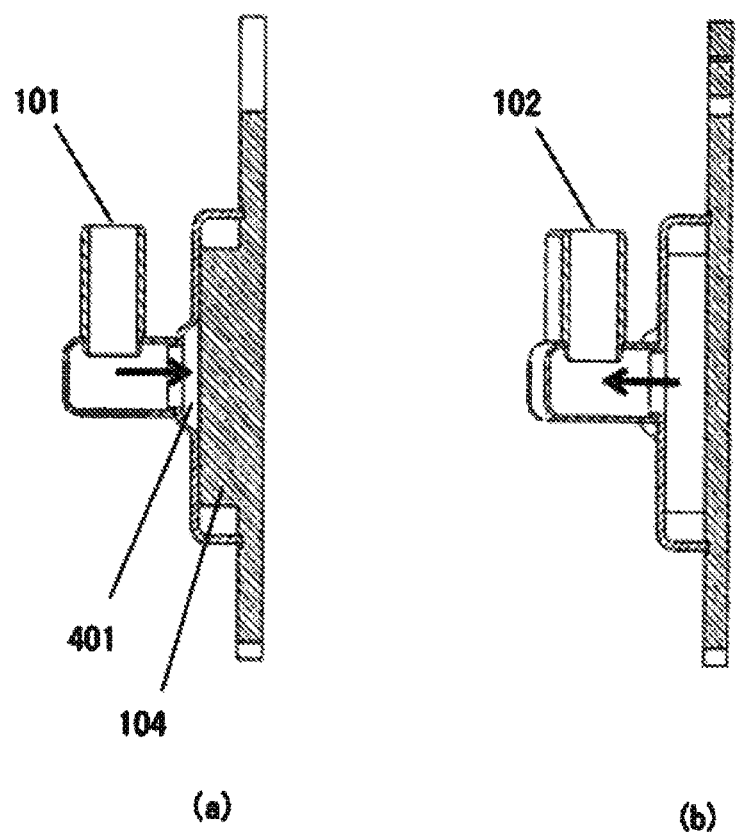
FIG. 7(a) is a view illustrating a cross-sectional structure of a portion including inflow port 101 illustrated in FIG. 6.
FIG. 7(b) is a view illustrating a cross-sectional structure of a portion including outflow port 102 illustrated in FIG. 6.

FIG. 7(*a*) illustrates a cross-sectional structure of a portion including inflow port 101 illustrated in FIG. 6. FIG. 7(*b*) illustrates a cross-sectional structure of a portion including outflow port 102 illustrated in FIG. 6.

As described above, first flow path 401 has the elongated shape so as to straddle all of respective fins configuring heat dissipating part 104. Therefore, as illustrated in FIG. 7(*a*), the coolant flowing into first flow path 401 through outflow port 101 can be supplied to clearances between respective fins configuring heat dissipating part 104 at the same temperature and simultaneously. Since the installation positions of light source bank 107 and heat dissipating part 104 are provided in such a manner that they coincide with each other across light source bank holder 105, light source bank holder 105 and the plurality of semiconductor light-emitting elements 301 accommodated in light source bank 107 can be cooled under the same conditions. As mentioned above, since the plurality of semiconductor light-emitting elements are not cooled under conventional temperature conditions different between an upstream side and a downstream side, the plurality of semiconductor light-emitting elements 301 can be cooled more uniformly.

The coolant having passed through heat dissipating part 401 flows out from outflow port 102, as illustrated in FIG. 7(*b*). Inflow port 101 and outflow port 102 are identical in cross-sectional area of the flow path. Further, first flow path 401 has the same cross-sectional area of the flow path. Setting the cross-sectional area of the flow path to be identical between inflow port 101 and outflow port 102 can equalize the velocity between the coolant flowing into inflow port 101 and the coolant flowing out from outflow port 102, thereby securing smooth flow of the coolant. The smoothness of the flow of the coolant can be further improved by setting first flow path 401 to be identical to inflow port 101 and outflow port 102 with respect to the cross-sectional area of the flow path.

In the light source device having the above-mentioned configuration according to the present exemplary embodiment, since the plurality of semiconductor light-emitting elements can be cooled more uniformly, the output light from each semiconductor light-emitting element can be suppressed from occurrence of luminance unevenness.

Second Exemplary Embodiment

Figure 8:
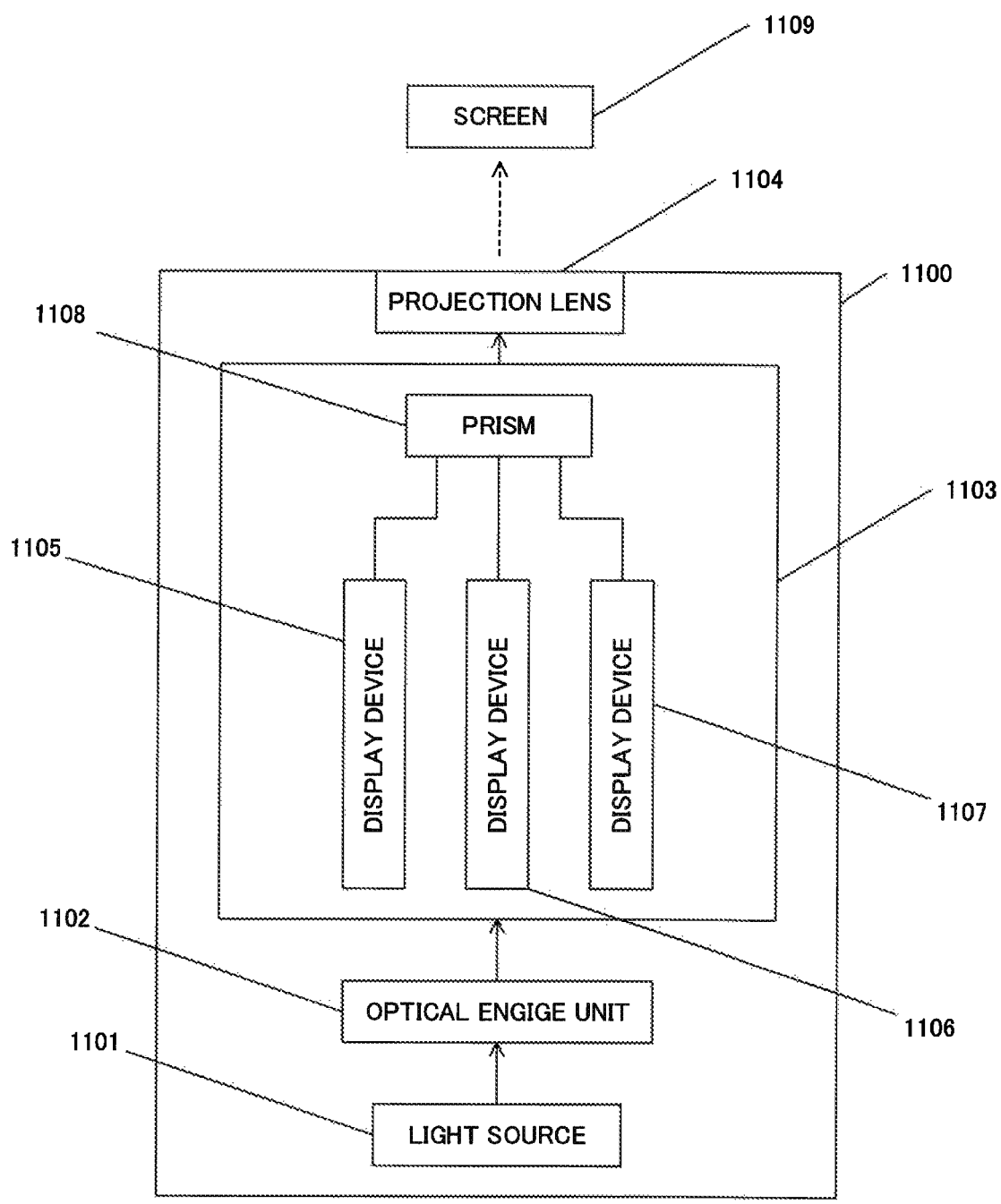
FIG. 8 is a block diagram illustrating the configuration of a projection-type display device according to an exemplary embodiment.

FIG. 8 is a block diagram illustrating the configuration of exemplary projection-type display device equipped with the light source device described in the first exemplary embodiment.

Projection-type display device 1100 includes light source 1101 equipped with the light source device described in the first exemplary embodiment, optical engine unit 1102, image formation unit 1103, and projection lens (projection optical system) 1104.

Image formation unit 1103 includes display devices 1105 to 1107 each modulating light according to an image signal and has a function of forming an image based on the light emitted from optical engine unit 1102. In the present exemplary embodiment, each of display devices 1105 to 1107 is a digital micro-mirror device (DMD) that is one of reflection-type display elements. Further, in the present exemplary embodiment, image formation unit 1103 is equipped with three display devices 1105 to 1107 corresponding to red light, green light, and blue light. Projection lens 1104 has a function of displaying an image by projecting the light emitted from image formation unit 1103 on screen 1109 or the like.

In addition, projection-type display device 1100 includes a cooling device for cooling the DMD of an image formation unit.

In the projection-type display device having the above-mentioned configuration according to the present exemplary embodiment, since the output light of the light source device capable of suppressing luminance unevenness is used, high-quality image light with suppressed color unevenness can be output.

REFERENCE SIGNS LIST

101 inflow port
102 outflow port
103 flow path cover
104 heat dissipating part
105 light source bank holder
106 light source substrate
107 light source bank

The invention claimed is:

1. A light source device, comprising:
a plurality of semiconductor light-emitting elements;
a light source hank that accommodates said plurality of semiconductor light-emitting elements; and
a light source bank holder that mounts said light source bank on a first surface and includes a cooling mechanism provided on a second surface that includes a back surface of the first surface,
wherein the cooling mechanism includes:
a heat dissipating part provided at a position corresponding to said light source bank with said light source bank holder interposed therebetween;
a flow path cover that covers the second surface so as to accommodate the heat dissipating part;
an inflow terminal into which a coolant flows, the inflow terminal being provided on the flow path cover;
an outflow terminal from which the coolant flows out, the outflow terminal being provided on the flow path cover, so that a flow path by the heat dissipating part is formed between the outflow terminal and the inflow terminal; and
another flow path that is smaller in resistance than the flow path formed in the heat dissipating part, and that is formed between the inflow terminal and the heat dissipating part, and
wherein the heat dissipating part with a fin configuration is provided between the inflow terminal and the light source bank holder.

2. The light source device according to claim 1, wherein the inflow terminal and the outflow terminal are similar in a cross-sectional area of the flow path.

3. The light source device according to claim 2, wherein said another flow path is similar to the inflow terminal and the outflow terminal in said cross-sectional area of the flow path.

4. The light source device according to claim 2, wherein the heat dissipating part is configured to include a plurality of parallel fins, and the first said another flow path is formed in such a way so as to straddle all respective fins.

5. The light source device according to claim 4, wherein the heat dissipating part has a rectangular shape, and said another flow path is formed so as to connect substantially centers of opposite sides that are parallel to the plurality of said respective fins.

6. A projection type display device comprising the light source device according to claim 1.

7. A semiconductor light-emitting element cooling method for cooling a plurality of semiconductor light-emitting elements accommodated in a light source bank, the method comprising:
   mounting said light source bank on a first surface of a light source bank holder, and providing a cooling mechanism on a second surface that includes a back surface of the first surface;
   as the cooling mechanism;
      providing a heat dissipating part at a position corresponding to said light source bank with said light source bank holder interposed therebetween;
      covering the second surface with a flow path cover so as to accommodate the heat dissipating part;
      providing an inflow terminal into which a coolant flows on the flow path cover;
      providing an outflow terminal from which the coolant flows out on the flow path cover, so that a flow path by the heat dissipating part is formed between the outflow terminal and the inflow terminal;
      forming another flow path smaller in resistance than the flow path formed in the heat dissipating part between the inflow terminal and the heat dissipating part; and
      providing the heat dissipating part with a fin configuration between the inflow terminal and the light source bank holder.

8. The light source device according to claim 1, wherein the heat dissipating part with the fin configuration is not provided between the outflow terminal and the light source bank holder.

9. The light source device according to claim 1, wherein a direction in which said another flow path extends and a surface of a fin in the fin configuration of the heat dissipating part are arranged perpendicular to each other.

10. The light source device according to claim 1, wherein, in a sequential direction of stacking of the heat dissipating part, the light source bank holder, and the light source bank, the inflow terminal overlaps with the fin configuration.

11. The light source device according to claim 1, wherein, in a sequential direction of stacking of the heat dissipating part, the light source bank holder, and the light source bank, the outflow terminal is disposed outside of an overlapping area of the fin configuration with the light source bank holder.

12. The light source device according to claim 1, wherein, in a sequential direction of stacking of the heat dissipating part, the light source hank holder, and the light source bank, an entirety of the outflow terminal is disposed outside of an overlapping area of the fin configuration with the light source hank holder, and the inflow terminal overlaps with the fin configuration.

13. The light source device according to claim 1, wherein the flow path cover, the inflow terminal, and the outflow terminal are provided on a same side of the second surface of the light source bank holder.

14. The light source device according to claim 1, in a sequential direction of stacking of the heat dissipating part, the light source bank holder, and the light source bank, an entirety of the flow path cover is disposed on a side of the second surface of the light source bank holder.

15. The semiconductor light-emitting element cooling method according to claim 7, wherein the fin configuration in the heat dissipating part is not provided between the outflow terminal and the light source bank holder.

16. The semiconductor light-emitting element cooling method according to claim 7, wherein a direction in which said another flow path extends and a surface of a fin in the fin configuration of the heat dissipating part are arranged perpendicular to each other.

17. The semiconductor light-emitting element cooling method according to claim 7, wherein, in a sequential direction of stacking of the heat dissipating part, the light source bank holder, and the light source bank, the inflow terminal overlaps with the fin configuration.

18. The semiconductor light-emitting element cooling method according to claim 7, wherein, in a sequential direction of stacking of the heat dissipating part, the light source bank holder, and the light source bank, the outflow terminal is disposed outside of an overlapping area of the fin configuration with the light source bank holder.

19. The semiconductor light-emitting element cooling method according to claim 7, wherein, in a sequential direction of stacking of the heat dissipating part, the light source bank holder, and the light source hank, an entirety of the outflow terminal is disposed outside of an overlapping area of the fin configuration with the light source bank holder, and the inflow terminal overlaps with the fin configuration.

20. The semiconductor light-emitting element cooling method according to claim 7, wherein the flow path cover, the inflow terminal, and the outflow terminal are provided on a same side of the second surface of the light source bank holder.

* * * * *